(12) United States Patent  
Terai et al.

(10) Patent No.: US 9,685,321 B2  
(45) Date of Patent: Jun. 20, 2017

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Masaya Terai, Kawasaki (JP); Shigeki Hattori, Kawasaki (JP); Hideyuki Nishizawa, Toshima (JP); Koji Asakawa, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/064,735

(22) Filed: Mar. 9, 2016

(65) Prior Publication Data  
US 2016/0284868 A1    Sep. 29, 2016

(30) Foreign Application Priority Data

Mar. 24, 2015   (JP) ................................. 2015-060238

(51) Int. Cl.  
  *H01L 27/115*   (2017.01)  
  *H01L 21/02*    (2006.01)  
  (Continued)

(52) U.S. Cl.  
  CPC .... *H01L 21/02282* (2013.01); *G11C 11/5664* (2013.01); *H01L 21/02118* (2013.01);  
  (Continued)

(58) Field of Classification Search  
  CPC ........... H01L 21/02282; H01L 51/0591; H01L 51/0077  
  (Continued)

(56) References Cited

U.S. PATENT DOCUMENTS 8,890,234 B2   11/2014   Terai et al.  
9,142,562 B2   9/2015    Hattori et al.  
(Continued)

FOREIGN PATENT DOCUMENTS

JP   2005-513786   5/2005  
JP   2007-154164   6/2007  
(Continued)

OTHER PUBLICATIONS

Myung-Han Yoon et al. "σ-π Molecular Dielectric Multilayers for Low-Voltage Organic Thin-Film Transistors", PNAS, vol. 102, No. 13, Mar. 29, 2005, 5 pages.  
(Continued)

*Primary Examiner* — Long K Tran  
*Assistant Examiner* — Thai T Vuong  
(74) *Attorney, Agent, or Firm* — Oblon, McClelland, Maier & Neustadt, L.L.P.

(57) ABSTRACT

A semiconductor memory device in an embodiment includes a semiconductor layer, a control gate electrode, an organic molecular layer provided between the semiconductor layer and the control gate electrode, and a first insulating layer provided between the organic molecular layer and the semiconductor layer, the first insulating layer having a first layer containing alkyl chains and a second layer containing siloxane, the second layer being provided between the first layer and the organic molecular layer.

8 Claims, 16 Drawing Sheets

(51) Int. Cl.
*H01L 21/28* (2006.01)
*G11C 11/56* (2006.01)
*H01L 51/05* (2006.01)
*H01L 27/11582* (2017.01)
*H01L 51/00* (2006.01)

(52) U.S. Cl.
CPC .... *H01L 21/28282* (2013.01); *H01L 51/0591* (2013.01); *H01L 27/11582* (2013.01); *H01L 51/0077* (2013.01)

(58) Field of Classification Search
USPC .......................................................... 257/324
See application file for complete search history.

(56) References Cited

U.S. PATENT DOCUMENTS

| | | | |
|---|---|---|---|
| 9,231,114 B2 | 1/2016 | Terai et al. | |
| 9,245,969 B2 | 1/2016 | Hattori et al. | |
| 2003/0111670 A1* | 6/2003 | Misra | B82Y 10/00 257/200 |
| 2004/0002617 A1* | 1/2004 | Rantala | C07F 7/0874 562/405 |
| 2006/0246643 A1* | 11/2006 | Ohsawa | G11C 13/0069 438/197 |
| 2007/0129473 A1 | 6/2007 | Shin et al. | |
| 2007/0278563 A1* | 12/2007 | Takano | H01L 21/28282 257/324 |
| 2007/0281400 A1* | 12/2007 | Yamazaki | H01L 21/28273 438/151 |
| 2012/0112171 A1 | 5/2012 | Hattori et al. | |
| 2012/0241713 A1* | 9/2012 | Nishizawa | G11C 13/0016 257/4 |
| 2013/0248962 A1 | 9/2013 | Morota et al. | |
| 2014/0097485 A1 | 4/2014 | Hattori et al. | |
| 2014/0231897 A1* | 8/2014 | Terai | G11C 13/0014 257/324 |
| 2015/0044835 A1 | 2/2015 | Hattori et al. | |
| 2015/0048438 A1 | 2/2015 | Terai et al. | |

FOREIGN PATENT DOCUMENTS

| | | |
|---|---|---|
| JP | 2012-104675 | 5/2012 |
| JP | 2013-197363 | 9/2013 |
| JP | 2015-38994 | 2/2015 |
| JP | 2016-28428 | 2/2016 |

OTHER PUBLICATIONS

U.S. Appl. No. 14/947,265, filed Nov. 20, 2015, Masaya Terai et al.

* cited by examiner

MEMORY CELL

SEMICONDUCTOR MEMORY DEVICE AND METHOD FOR MANUFACTURING THE SAME

CROSS-REFERENCE TO RELATED APPLICATION

This application is based upon and claims the benefit of priority from Japanese Patent Application No. 2015-060238, filed on Mar. 24, 2015, the entire contents of which are incorporated herein by reference.

FIELD

Embodiments described herein relate generally to semiconductor memory devices and method for manufacturing the same.

BACKGROUND

As a method for achieving a lower bit cost of nonvolatile semiconductor memory devices and improving memory performance, scaling-down of memory cells is effective. However, scaling-down of memory cells has become technically difficult.

Thus, it has been proposed to use organic molecules in charge storage layers. Using various synthesized various molecular structures or substituents, desired electrochemical properties can be imparted to organic molecules. Since structural unit of organic molecule is small, the thickness and width of charge storage layers can be reduced, and thus scaling-down of memory cells can be achieved.

Fabrication of memory cell using three-dimensional stacked structure is one of the methods for achieving a lower bit cost of nonvolatile semiconductor memory devices. When three-dimensional stacked structure a memory cell arrangement is made three-dimensional, by thinning the total film-thickness of a memory cell, a higher density of memory cells can be achieved. Thus, for example, it is required to reduce the thickness of insulating layers such as a tunnel insulating film and a block insulating film. When a tunnel insulating film is made thinner, degradation in charge retention characteristics due to an increase in leak current becomes a problem.

DETAILED DESCRIPTION

Figure 1:
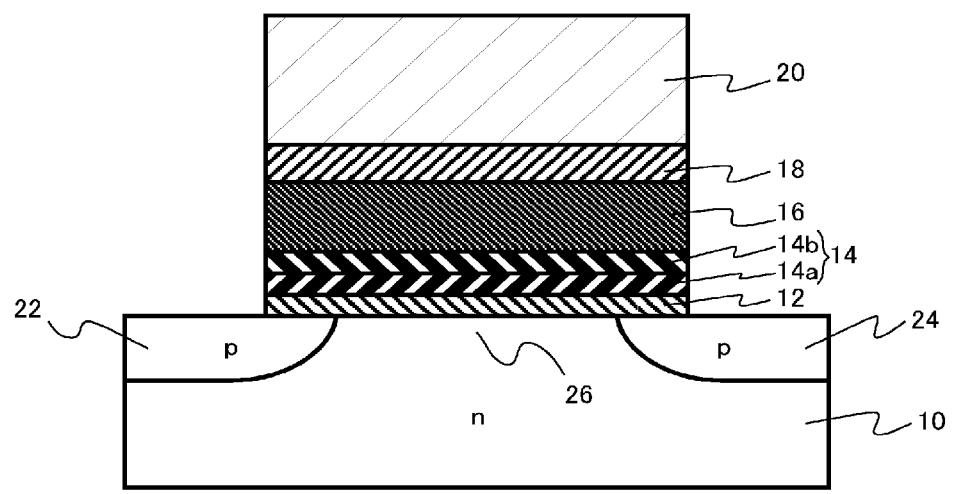
FIG. 1 is a cross-sectional view of a memory cell portion of a semiconductor memory device according to a first embodiment.

A semiconductor memory device in an embodiment includes a semiconductor layer, a control gate electrode, an organic molecular layer provided between the semiconductor layer and the control gate electrode, and a first insulating layer provided between the organic molecular layer and the semiconductor layer, the first insulating layer having a first layer containing alkyl chains and a second layer containing siloxane, the second layer being provided between the first layer and the organic molecular layer.

In this description, the same or similar members are denoted by the same reference numerals, and redundant descriptions may be omitted.

In this description, the words "on" and "below" are used to describe the relative positional relationships between components or others. In the description, the words "on" and "below" do not necessarily conceptually mean a relationship with the direction of gravity.

In this description, the word "layer" is defined as meaning a case where each of elements considered to constitute a layer have an area density of 10 to the power of twelve per square centimeter or more.

Hereinafter, embodiments will be described with reference to the drawings.

First Embodiment

A semiconductor memory device in an embodiment includes a semiconductor layer, a control gate electrode, an organic molecular layer provided between the semiconductor layer and the control gate electrode, and a first insulating layer provided between the organic molecular layer and the semiconductor layer, the first insulating layer having a first layer containing alkyl chains and a second layer containing siloxane, the second layer being provided between the first layer and the organic molecular layer.

The semiconductor memory device in this embodiment further includes a second insulating layer provided between the semiconductor layer and the first insulating layer, and a third insulating layer provided between the organic molecular layer and the control gate electrode.

Figure 2:
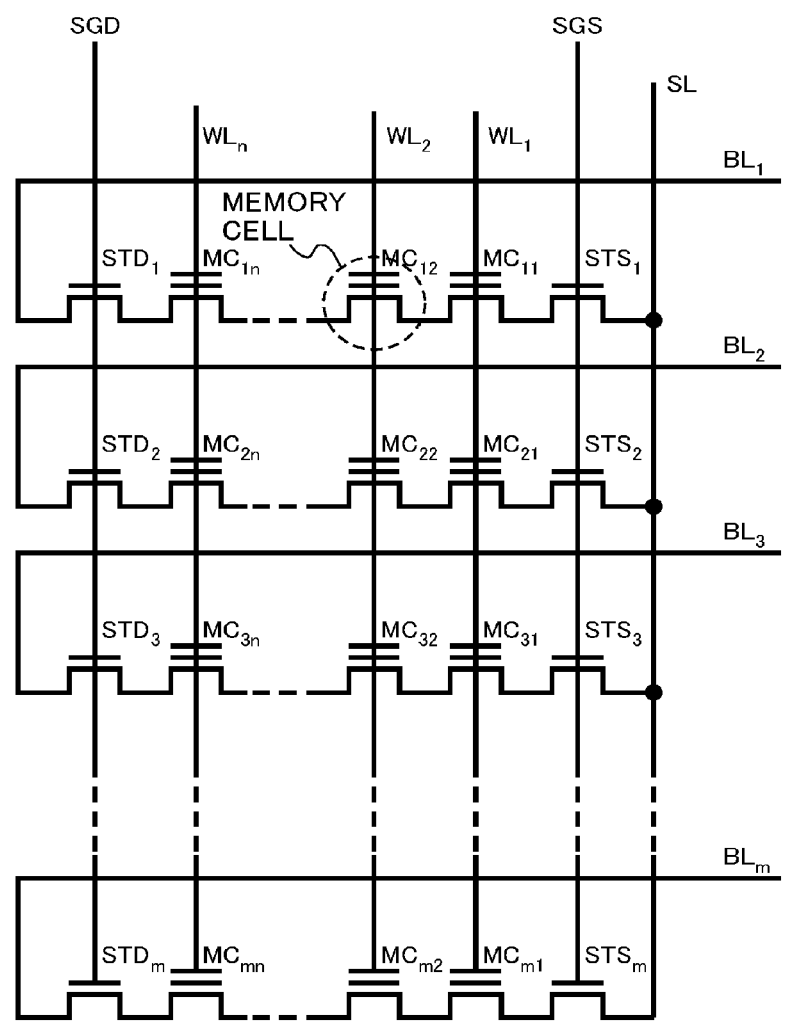
FIG. 2 is a circuit diagram of a memory cell array of the semiconductor memory device according to the first embodiment.

FIG. 1 is a cross-sectional view of a memory cell portion of the semiconductor memory device in this embodiment. FIG. 2 is a circuit diagram of a memory cell array of the semiconductor memory device in this embodiment. A nonvolatile semiconductor memory device in this embodiment is a NAND nonvolatile semiconductor memory device.

As shown in FIG. 2, for example, the memory cell array includes m×n (m, n are integers) transistors of a floating gate structure, memory cell transistors $MC_{11}$ to $MC_{1n}$, $MC_{21}$ to $MC_{2n}$, ..., $MC_{m1}$ to $MC_{mn}$. In the memory cell array, by aligning the memory cell transistors in a row direction and a column direction, the memory cell transistors are disposed in a matrix.

In the memory cell array, for example, the memory cell transistors $MC_{11}$ to $MC_{1n}$ and select gate transistors $STS_1$, $STD_1$ are connected in series, constituting a NAND string (memory string), a cell unit.

A drain region of the select gate transistor $STS_1$ that selects the memory cell transistors $MC_{11}$ to $MC_{1n}$ is connected to a source region of the memory cell transistor $MC_{11}$ located at an end of the row of a group of the memory cell transistors $MC_{11}$ to $MC_{1n}$ connected in series. A source region of the select gate transistor $STD_1$ that selects the memory cell transistors $MC_{11}$ to $MC_{1n}$ is connected to a drain region of the memory cell transistor $MC_{1n}$ located at an end of the row of the group of the memory cell transistors $MC_{11}$ to $MC_{1n}$ connected in series.

Select gate transistors $STS_2$ to $STS_m$, the memory cell transistors $MC_{21}$ to $MC_{2n}$, ..., $MC_{m1}$ to $MC_{mn}$, and select gate transistors $STD_2$ to $STD_m$ are connected in series, separately, in the same manner, constituting NAND strings.

A common source line SL is connected to sources of the select gate transistors $STS_1$ to $STS_m$. The memory cell transistors $MC_{11}$, $MC_{21}$, ..., $MC_{m1}$, the memory cell transistors $MC_{12}$, $MC_{22}$, ..., $MC_{m2}$, ..., the memory cell transistors $MC_{1n}$, $MC_{2n}$, ..., $MC_{mn}$ are connected by word lines $WL_1$ to $WL_n$ that control an operating voltage applied to control gate electrodes, respectively.

A common select gate line SGS of the select gate transistors $STS_1$ to $STS_m$ and a common select gate line SGD of the select gate transistors $STD_1$ to $STD_m$ are also provided.

A peripheral circuit not shown is formed around the memory cell array in FIG. 2.

FIG. 1 shows a cross-section of a memory cell in the memory cell array shown in FIG. 2, for example, a memory cell enclosed by a dotted line in FIG. 2. This embodiment will be described with an example where a transistor of the memory cell is a p-type transistor that uses holes as carriers.

The memory cell includes a semiconductor layer 10, a tunnel insulating layer (second insulating layer) 12, an organic tunnel insulating layer (first insulating layer) 14, a charge storage layer (organic molecular layer) 16, a block insulating layer (third insulating layer) 18, and a control gate electrode 20. The memory cell also includes a source, a drain region 24, and a channel region 26.

The tunnel insulating layer 12 is provided on the semiconductor layer 10. The organic tunnel insulating layer 14 is provided on the tunnel insulating layer 12. The charge storage layer 16 is provided on the organic tunnel insulating layer 14. The block insulating layer 18 is provided on the charge storage layer 16. The control gate electrode 20 is provided on the block insulating layer 18.

The source region 22, the drain region 24, and the channel region 26 are provided in the semiconductor layer 10. A region in the semiconductor layer 10 below the control gate electrode 20 constitutes the channel region 26. The channel region 26 is sandwiched between the source region 22 and the drain region 24.

The charge storage layer 16 has a function of actively storing charges as memory cell information.

During writing or erasing of the memory cell, the tunnel insulating layer 12 and the organic tunnel insulating layer 14 serve as an electron or hole moving path between the channel region 26 in the semiconductor layer 10 and the charge storage layer 16 due to a charge tunneling phenomenon.

During reading and on standby, the tunnel insulating layer 12 and the organic tunnel insulating layer 14 have a function of inhibiting electron hole movement between the channel region 26 and the charge storage layer 16. The barrier height of the tunnel insulating layer 12 and the organic tunnel insulating layer 14 inhibits electron or hole movement between the channel region 26 and the charge storage layer 16. Further, by the tunnel insulating layer 12 and the organic tunnel insulating layer 14 decreasing the tunneling probability of charges, electron-hole movement between the channel region 26 and the charge storage layer 16 is inhibited.

The block insulating layer 18 has a function of blocking the flow of electrons and holes between the charge storage layer 16 and the control gate electrode 20. The block insulating layer 18 is a so-called interelectrode insulating film.

The semiconductor layer 10 is, for example, n-type single crystal silicon containing n-type impurities. For the semiconductor layer 10, other than silicon, a silicon germanide, germanium, a compound semiconductor, or the like may be used.

The tunnel insulating layer 12 is formed with an inorganic compound. The thickness of the tunnel insulating layer 12 is, for example, between 0.5 nm and 8 nm inclusive.

The tunnel insulating layer 12 is, for example, silicon oxide ($SiO_2$). The material of the tunnel insulating layer 12 is not limited to silicon oxide, and other insulating films may be used. For example, silicon nitride or a stacked film of silicon oxide and silicon nitride may be used.

Further, for example, a material for promoting chemical bonding (chemical adsorption) of organic molecules constituting the organic tunnel insulating layer 14 to the surface of the tunnel insulating layer 12 may be provided. For example, aluminum oxide is placed on silicon oxide in layers.

The organic tunnel insulating layer 14 includes an alkyl layer (first layer) 14a and a siloxane layer (second layer) 14b. The alkyl layer 14a is provided on the tunnel insulating layer 12. The siloxane layer 14b is provided on the alkyl layer 14a.

The alkyl layer 14a contains alkyl chains. The carbon number of each alkyl chain is desirably between 4 and 30 inclusive. The alkyl layer 14a is, for example, an organic monolayer.

The alkyl layer 14a is chemically bonded to the tunnel insulating layer 12. The alkyl layer 14a is chemically bonded to the tunnel insulating layer 12 via modifying substituents provided at an end of the alkyl chains. The modifying substituents are so-called linkers. Examples of a linker include a silyl group, a phosphoryl group, a selenide group, a telluride group, an isocyanate group, an alkyl bromide group, an alkoxy group, an ether group, and a sulfide group.

The siloxane layer 14b contains siloxane in the molecular structure.

The molecular structure constituting the alkyl layer 14a and the molecular structure constituting the siloxane layer 14b are chemically bonded together at least partly.

The organic tunnel insulating layer 14 contains a structure formed by chemical bonding of a first precursor described by molecular formula (1) and a second precursor described by molecular formula (2):

$$X-C_nH_{2n}-Y \quad (1)$$

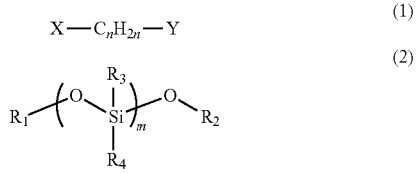

(2)

wherein X, Y are independently selected from among silyl ether, phosphoryl ether, alkoxy, carbonyl, and ether, n is an integer greater than 0, $R_1$ to $R_4$ are independently selected from hydrogen, oxygen, silicon, hydrocarbon, halogen, halogenated silane, alkoxy silane, and silyl ether, and m is an integer greater than 0.

The alkyl layer 14a contains a molecular structure derived from the first precursor. The siloxane layer 14b contains a molecular structure derived from the second precursor.

The thickness of the organic tunnel insulating layer 14 is desirably between 0.5 nm and 5 nm inclusive.

The charge storage layer 16 contains oxidation-reduction molecules. The oxidation-reduction molecules are charge storage molecules. The charge storage layer 16 includes a monomolecular film, for example. The thickness of the charge storage layer 16 is desirably 20 nm or less in terms of scaling-down of memory cells.

The oxidation-reduction molecules constituting the charge storage layer 16 have a function of storing charges by the application of an electric field. In particular, in order to achieve scaling-down of memory cells, it is desirable to use a monomolecular film.

When a monomolecular film is used, the oxidation-reduction molecule is functionally divided into a charge storage portion and an adsorption group portion. For the charge storage portion, a molecular structure that stably produces oxidation-reduction reaction is selected. Examples of the molecular structure include a porphyrin derivative, a phthalocyanine derivative, a chlorine derivative, a tetrapyrrole derivative, a bipyridine derivative, an indole derivative, an acene derivative, a quinoxaline derivative, a fullerene derivative, and a metal complex.

The adsorption group portion has a function of fixing the oxidation-reduction molecule onto the organic tunnel insulating layer 14 by chemical bonding. When an oxidation-reduction molecular structure includes one adsorption group portion, the charge storage layer 16 is a monomolecular film.

By the charge storage layer 16 being a monomolecular film, a temperature at which the oxidation-reduction molecules are evaporated, vaporized, or decomposed when heated becomes higher. Thus, the heat resistance of the charge storage layer 16 is increased.

An intermediate layer not shown may be provided between the charge storage layer 16 and the organic tunnel insulating layer 14. The intermediate layer promotes chemical adsorption of the oxidation-reduction molecules constituting the charge storage layer 16 during formation of the charge storage layer 16. The intermediate layer is, for example, aluminum oxide.

The block insulating layer 18 is an inorganic substance. The block insulating layer 18 is, for example, a metal-oxide film, for example, hafnium oxide. Other than hafnium oxide ($HfO_2$), for example, aluminum oxide ($Al_2O_3$) or the like is used for the block insulating layer 18.

The block insulating layer 18 may be a single-layer film or a stacked film. The block insulating layer 18 is, for example, a metal oxide film formed by an atomic layer deposition (ALD) method.

The control gate electrode 20 is, for example, polycrystalline silicon to which impurities are introduced and conductivity is imparted. For the control gate electrode 20, any conductive material may be used. Other than polycrystalline silicon described above, for example, amorphous silicon to which impurities are introduced and conductivity is imparted may be used for the control gate electrode 20. Alternatively, a metal, an alloy, a metal-semiconductor compound, or the like may be used for the control gate electrode 20.

The source region 22 and the drain region 24 are formed, for example, by a p-type diffusion layer containing p-type impurities.

Figure 3:
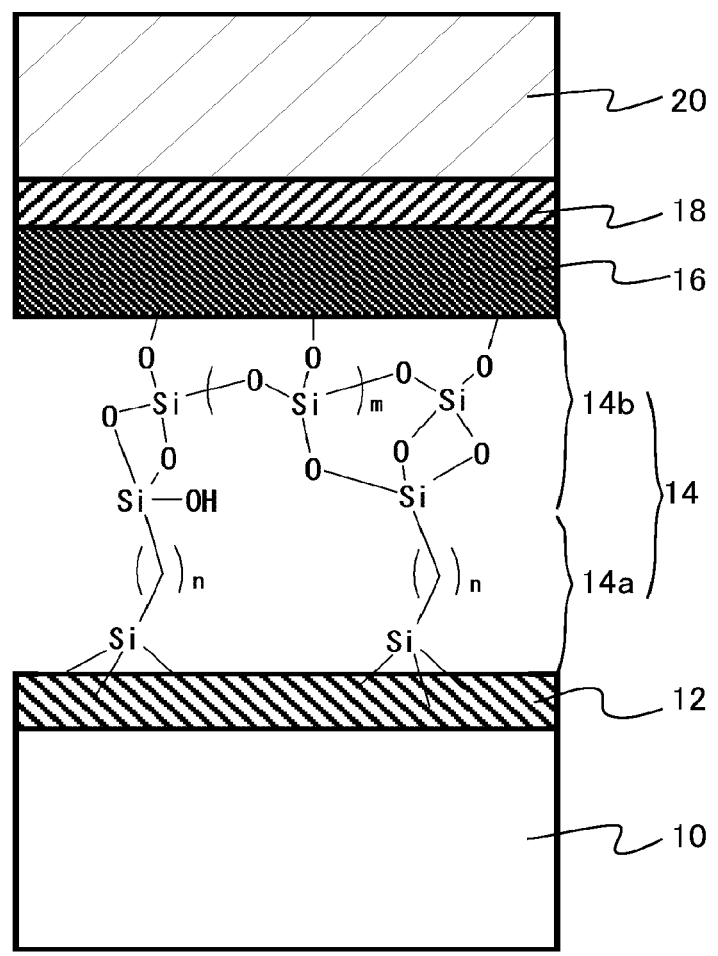
FIG. 3 is an enlarged schematic diagram of an example of the memory cell portion of the semiconductor memory device according to the first embodiment.

FIG. 3 is an enlarged schematic diagram of an example of the memory cell portion of the semiconductor memory device in this embodiment, a diagram showing an example of the structure of organic molecules used in the organic tunnel insulating layer 14.

The organic tunnel insulating layer 14 is a stacked film of the alkyl layer 14a formed by reaction of the first precursor represented by molecular formula (1) and the siloxane layer 14b formed by reaction of the second precursor represented by molecular formula (2).

For example, when molecules contain structures with a plurality of bonding hands such as a silyl group and siloxane as shown in FIG. 3, it is difficult to strictly represent a bonding form of the molecules by a molecular structural formula. Therefore, the bonding form of the molecules shown in FIG. 3 is an example, and there are many other bonding forms.

The molecules constituting the organic tunnel insulating layer 14 can be detected using a mass spectroscopy (MS), a secondary ion mass spectroscopy (SIMS), a nuclear magnetic resonance spectroscopy (NMR), an element analyzer, infrared reflection absorption spectroscopy (IR-RAS), an X-ray fluorescence spectroscopy (XRF), X-ray photoelectron spectroscopy (XPS), an ultraviolet and visible spectroscopy (UV-vis), a spectrofluorophotometer (FL), electron energy-loss spectroscopy (EELS), or the like.

The oxidation-reduction molecules constituting the charge storage layer 16 can be detected using a mass spectrometer (MS), a secondary ion mass spectrometer (SIMS), a nuclear magnetic resonator (NMR), an element analyzer, infrared reflection absorption spectroscopy (IR-RAS), an X-ray fluorescence spectrometer (XRF), X-ray photoelectron spectroscopy (XPS), an ultraviolet and visible spectrophotometer (UV-vis), a spectrofluorophotometer (FL), electron energy-loss spectroscopy (EELS), or the like.

When an insulating film such as a metal oxide is formed on the charge storage layer 16, the charge storage layer 16 is analyzed with the surface being removed by a sputtering device using argon ions, for example. Alternatively, the charge storage layer 16 is dissolved and removed simultaneously with the insulating film using a hydrofluoric acid aqueous solution or the like, and the solution is analyzed.

In the analysis method by removing the surface by a sputtering device or the like, heating treatment may be performed simultaneously. In this case, gas containing a removed substance may be adsorbed onto another substance such as activated carbon for analysis. In the method of dissolving the charge storage layer 16 and analyzing the solution, the solution may be concentrated by decompression or heating treatment, and then analyzed for detection.

During a write operation of the memory cell in this embodiment, a voltage is applied between the control gate electrode 20 and the semiconductor layer 10 so that the control gate electrode 20 has a relatively negative voltage to store positive charges in the charge storage layer 16. When the control gate electrode 20 has a relatively negative voltage, an inversion layer is formed in the channel region 26, and holes accumulate. The holes move through the tunnel insulating layer 12 and the organic tunnel insulating layer 14 to be stored in the charge storage molecules in the charge storage layer 16.

In this state, the threshold voltage of the memory cell transistor becomes higher than that in a state where no holes are stored. That is, the transistor is in a state of being hard to turn on. This state is a state where data "0" is written.

During a data erase operation, a voltage is applied between the control gate electrode 20 and the semiconductor layer 10 so that the control gate electrode 20 has a relatively positive voltage. An electric field between the control gate electrode 20 and the semiconductor layer 10 causes holes stored in the charge storage layer 16 to move through the tunnel insulating layer 12 and the organic tunnel insulating layer 14 to be pulled out to the semiconductor layer 10.

In this state, the threshold voltage of the memory cell transistor is lower than that in the data "0" state. That is, the transistor is in a state of being easy to turn on. This state is data "1."

During reading of data, a voltage is applied between the source region 22 and the drain region 24. For example, in the data "0" state where holes are stored, an inversion layer is not formed in the channel region 26 since the threshold voltage of the transistor is high, and no current flows between the source and the drain.

On the other hand, in an erased state, that is, the data "1" state where no charges are stored, an inversion layer is formed in the channel region 26 since the threshold voltage of the transistor is low, and a current flows between the source and the drain. Thus, by detecting the amount of current through the transistor, it is possible to read whether it is data "0" or data "1."

During a data verification operation to verify whether writing is performed adequately after the data write operation is performed, an operation similar to that during the read operation is performed. A voltage is applied between the source region 22 and the drain region 24. When a desired current does not flow, the data write operation is performed again.

The write, erase, and read operations of the memory cell in this embodiment are performed as above for the function as a nonvolatile semiconductor memory device.

A method for manufacturing a semiconductor memory device in this embodiment will be described.

The method for manufacturing the semiconductor memory device in this embodiment includes forming a first layer on a semiconductor layer by immersing the semiconductor layer in a first solution containing a first precursor described by molecular formula (1), forming a second layer on the first layer by immersing a surface of the first layer in a second solution containing a second precursor described by molecular formula (2), forming an organic molecular layer containing oxidation-reduction molecules on a surface of the second layer, and forming a control gate electrode on the organic molecular layer:

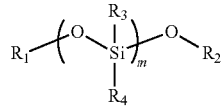

wherein X, Y are independently selected from among silyl ether, phosphoryl ether, alkoxy, carbonyl, and ether, n is an integer greater than 0, $R_1$ to $R_4$ are independently selected from hydrogen, oxygen, silicon, hydrocarbon, halogen, halogenated silane, alkoxy silane, and silyl ether, and m is an integer greater than 0.

For example, the tunnel insulating layer 12 is formed on the semiconductor layer 10 of single crystal silicon. The tunnel insulating layer 12, when it is silicon oxide, is formed by thermal oxidation of the semiconductor layer 10.

Alternatively, the tunnel insulating layer 12 can be formed by an ALD method or a sputtering method. It is desirable to anneal a formed insulating film in a rapid thermal annealing (RTA) apparatus.

Next, the organic tunnel insulating layer 14 is formed on the tunnel insulating layer 12. When the organic tunnel insulating layer 14 is formed, for example, the following method can be used.

First, a surface on the tunnel insulating layer 12 is cleaned. For this cleaning, for example, cleaning using a mixed solution of sulfuric acid and a hydrogen peroxide solution (the mixing ratio is e.g. 2:1), or UV cleaning that irradiates an insulating film surface with ultraviolet light can be used.

Next, alkyl molecules described by molecular formula (1) are prepared as the first precursor. The cleaned surface of the tunnel insulating layer 12 is immersed in a solution in which the first precursor is dissolved in a solvent. Then, X or Y of the first precursor is reacted with the surface of the tunnel insulating layer 12 to form the alkyl layer (first layer) 14a.

X, Y of the first precursor described by molecular formula (1) have a function of chemically bonding an alkyl chain to an oxide surface on the semiconductor layer 10, on the tunnel insulating layer 12, or the like by a covalent bond. When there are two adsorption groups X, Y per molecule, there is a possibility that both X and Y react with the top of the same surface. However, by controlling the magnitude of n and adjusting conditions of film formation, it is possible to attach only either X or Y to the surface.

When the number of n in molecular formula (1) is increased, intermolecular forces between alkyl chains act, and thus the orientation of the alkyl chains becomes uniform, resulting in a dense film. On the other hand, when the value of n is increased, the film thickness becomes thicker, and both X and Y tend to adsorption-react with the same surface. Therefore, n is desirably between 4 and 30 inclusive.

For the solvent, one in which organic molecules have a high degree of solubility is used. For example, an organic solvent such as acetone, toluene, ethanol, methanol, hexane, cyclohexanone, isopropyl alcohol, or pentane can be used.

When X or Y is a substituent rich in reactivity, the immersion operation is performed under an environment from which water is removed, for example, in a glove box. In this case, there is a case where a solvent from which water contained in the solvent is removed may be used. For example, dehydrated toluene, dehydrated pentane, or the like is used. It is also possible to use a mixed solvent of dehydrated toluene and dehydrated pentane as a solvent.

When the concentration of the first precursor dissolved in a solvent is too low, reaction time becomes longer. When it is too high, excess adsorbed molecules that need to be removed by a rinse operation increase. Thus, it is desirable to set an appropriate concentration. For example, the concentration is desirably set at between 0.1 mM and 100 mM inclusive.

Time to immerse the surface of the tunnel insulating layer 12 in the first precursor solution is desirably time for sufficient reaction between the surface of the tunnel insulating layer 12 and the first precursor. Specifically, it is desirably one minute or more. On the other hand, when the immersion time is too long, X and Y of the first precursors react with each other, inhibiting formation of the uniformly thin alkyl layer 14a. The immersion time is desirably twelve hours or less.

Thereafter, the surface of the alkyl layer 14a is cleaned. By the cleaning, excess organic matter physically adsorbed on the surface of the tunnel insulating layer 12 or the alkyl layer 14a is washed away. As the cleaning, a rinse using a solvent is performed. Alternatively, ultrasonic cleaning may be performed.

Next, siloxane molecules described by molecular formula (2) are prepared as the second precursor. A surface of the alkyl layer 14a is immersed in a solution in which the second precursor is dissolved in a solvent. Then, X or Y of the first precursor is reacted with the second precursor to form the siloxane layer 14b.

The second precursor described by molecular formula (2) includes siloxane bonds. An unreacted portion of X or Y coming to the surface of the alkyl layer 14a and the second precursor react with each other, forming the siloxane layer 14b on the alkyl layer 14a.

For example, when molecules having high reactivity with water such as trichlorosilane represented by molecular formula (3) are used as the second precursor, a solvent from which water is removed is used. For example, dehydrated toluene, dehydrated pentane, or the like is used. It is also possible to use a mixed solvent of dehydrated toluene and dehydrated pentane. In this case, immersion and rinse operations are performed under an environment from which water is removed, for example, in a glove box.

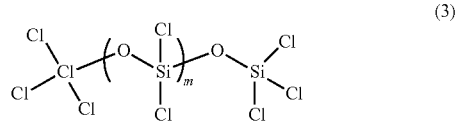

(3)

When the concentration of the second precursor dissolved in a solvent is too low, reaction time becomes longer. When it is too high, excess adsorbed molecules that need be removed by a rinse operation increase. Thus, it is desirable to set an appropriate concentration. For example, the concentration is desirably between 0.1 mM and 100 mM inclusive.

Time to immerse the surface of the alkyl layer 14a in the second precursor solution is desirably time for sufficient reaction between the surface of the alkyl layer 14a and the second precursor. Specifically, it is desirably one minute or more. On the other hand, when the immersion time is too long, reaction between the second precursors proceeds, inhibiting formation of the uniformly thin siloxane layer 14b.

Thereafter, the surface of the siloxane layer 14b is cleaned. By the cleaning, excess organic compound physically adsorbed on the surface of the alkyl layer 14a or the siloxane layer 14b is washed away. As the cleaning, a rinse using a solvent is performed. Alternatively, ultrasonic cleaning may be performed.

Thereafter, to cause hydroxyl groups to come to the surface of the siloxane layer 14b, the surface of the siloxane layer 14b is immersed in a solution containing water. The solution containing water may be a solvent simple substance such as alcohol or ketone, or may be a mixed aqueous solution in which water is mixed in the solvent.

Thereafter, the surface of the siloxane layer 14b is immersed in ethanol and rinsed using an ultrasonic cleaning machine.

Thereafter, by a nitrogen air gun or a spin coater, ethanol is removed, and the surface is dried. With this, the organic tunnel insulating layer 14 formed from the first precursor represented by molecular formula (1) and the second precursor represented by molecular formula (2) is formed on the tunnel insulating layer 12.

Next, the charge storage layer 16 is formed on the organic tunnel insulating layer 14.

When the charge storage layer 16 is formed, for example, the following method can be used.

An oxidation-reduction molecule is functionally divided into a charge storage portion and an adsorption substituent portion. For the charge storage portion, a molecular structure that stably produces oxidation-reduction reaction is selected. The adsorption substituent portion has a function of fixing the oxidation-reduction molecule onto the organic tunnel insulating layer 14 by chemical bonding. The surface of the organic tunnel insulating layer 14 is immersed in a solution in which oxidation-reduction molecules are dissolved in a solvent. With this, the adsorption substituent portions react with the surface of the organic tunnel insulating layer 14, forming the charge storage layer 16.

For the purpose of promoting chemical bonding of the oxidation-reduction molecules onto the organic tunnel insulating layer 14, a thin film of another material may be formed. For example, an aluminum oxide film is formed. In this case, the oxidation-reduction molecules are chemically bonded to the aluminum oxide surface.

As the solvent of the oxidation-reduction molecules, one in which organic molecules have a high degree of solubility is used. For example, an organic solvent such as acetone, toluene, ethanol, methanol, hexane, cyclohexanone, isopropyl alcohol, or propylene glycol monomethyl ether acetate (PEGMA) is used. It is also possible to use a mixed solution of them as a solvent. For oxidation-reduction molecules that dissolve in water, water can be used as a solvent.

When the concentration of the oxidation-reduction molecules dissolved in a solvent is too low, reaction time becomes longer. When it is too high, excess adsorbed molecules that need to be removed by a rinse operation increase. Thus, it is desirable to set an appropriate concentration. For example, the concentration is desirably between 0.01 mM and 100 mM inclusive.

Time to immerse the surface of the organic tunnel insulating layer 14 in the oxidation-reduction molecule solution is desirably time for sufficient reaction to occur. Specifically, it is desirably one minute or more.

In order to promote adsorption reaction of the oxidation-reduction molecules, a catalyst may be added. As a catalyst, for example, an acid or a base is selected to promote hydrolysis. The amount of addition of a catalyst is desirably set small since when it is too large, the oxidation-reduction molecules self-react in the solvent, causing side reaction such as polymerization. The amount of addition of a catalyst is desirably 3% or less relative to the volume of the solution.

Thereafter, the charge storage layer 16 is immersed in a solvent and rinsed using an ultrasonic cleaning machine. In terms of sufficiently removing excess physically-adsorbed organic compound, this operation is desirably performed at least twice, using a new solvent.

Next, the charge storage layer 16 is immersed in ethanol and rinsed using an ultrasonic cleaning machine.

Thereafter, by a nitrogen air gun, a spin coater, or the like, the solvent is removed and the substrate is dried. With this, the charge storage layer 16 including the oxidation-reduction molecules is formed on the organic tunnel insulating layer 14.

Thereafter, for example, a hafnium oxide is deposited on the charge storage layer 16 to form the block insulating layer 18.

The block insulating layer 18 can be formed by a film-forming apparatus using ALD, sputtering, or the like. For the film-forming apparatus, a low-damage film-forming apparatus in which the organic tunnel insulating layer 14 and the charge storage layer 16 formed with organic molecules are not decomposed is desirably used. For example, a thermal ALD apparatus is desirably used. The formed block insulating layer 18 is desirably annealed by an RTA apparatus to increase the atomic density in the film.

Next, for example, a polycrystalline silicon film doped with impurities is formed on the block insulating layer 18 by a chemical vapor deposition (CVD) method. Thereafter, by patterning the stacked film, a gate electrode structure including the control gate electrode 20 is formed.

Next, for example, with the control gate electrode 20 as a mask, p-type impurities are ion-implanted into the semiconductor layer 10 to form the source region 22 and the drain region 24. The above manufacturing method enables the manufacturing of the semiconductor memory device shown in FIG. 1.

Next, the function and effect of the semiconductor memory device in this embodiment will be described.

First, the semiconductor memory device in this embodiment can reduce the thickness and width of the charge storage layer 16 by using oxidation-reduction molecules (organic molecules) in the charge storage layer 16. Thus, scaling-down of memory cells is achieved.

The semiconductor memory device in this embodiment further includes the organic tunnel insulating layer 14. An insulating film using alkyl chains, in particular, a self-assembled monolayer (SAM) has a high insulating property. For example, the insulating property of a SAM using molecules in which an adsorption group is attached to one end of an alkyl chain is higher than that of an inorganic insulating film such as silicon oxide ($SiO_2$) in a film-thickness range of 3 nm and less.

A SAM using alkyl chains is lower than silicon oxide, for example, in the overlap integral of the wave functions of charges in a thin film-thickness range (e.g. 3 nm and less). Thus, the tunneling probability of charges is reduced.

The bandgap of a SAM of alkyl chains is relatively large, for example, in some data, is about 9.2±0.3 eV with twelve carbons by actual measurement. However, in a thin film-thickness range, charges move due to a phenomenon called direct tunneling, which does not depend on the band gap. Therefore, it is considered that a reduction in the tunneling probability of charges more greatly contributes to the inhibition of movement of charges in a thin film-thickness range than the magnitude of the band gap.

However, when a high voltage is applied to a SAM of alkyl chains, there is a problem that a near-dielectric breakdown-mode current flows. In addition, when a metal electrode is formed directly on a SAM of alkyl chains by a heating vapor deposition method or the like, there is a problem that a conductive path is formed, varying the characteristics. The conductive path is produced by migration of heated metal particles into the SAM. Both of the problems are considered to be due to the instability of the molecular orientation of the alkyl chains in the SAM.

The organic tunnel insulating layer 14 of the semiconductor memory device in this embodiment has a stacked structure of the alkyl layer 14a containing alkyl chains and the siloxane layer 14b containing siloxane. For the organic tunnel insulating layer 14, the alkyl chains are chemically bonded to the surface of the base to form the alkyl layer 14a, and siloxane is chemically bonded to the surface of the alkyl layer 14a to form the siloxane layer 14b. This configuration inhibits passing of charges retained in the charge storage layer 16 therethrough to the semiconductor layer 10 side. Therefore, the charge retention characteristics (data retention characteristics) of the memory cell are improved.

The provision of the siloxane layer 14b firmly fixes the molecular orientation of the alkyl chains in the alkyl layer 14a. Thus, it is considered that the molecular orientation of the alkyl chains in the alkyl layer 14a is stabilized, improving the characteristics of the insulating layer.

According to the semiconductor memory device in this embodiment, by using the organic tunnel insulating layer 14, a tunnel insulating layer can be made thinner than in the case of using an inorganic tunnel insulating layer. Thus, the total film-thickness of a memory cell can be thinned to achieve a higher density of memory cells.

By providing the inorganic tunnel insulating layer 12 between the semiconductor layer 10 and the organic tunnel insulating layer 14 as in this embodiment, the molecular alignment of the alkyl chains is further stabilized, improving the charge retention characteristics (data retention characteristics) of the memory cell.

Second Embodiment

A semiconductor memory device in this embodiment is identical to that in the first embodiment except that a plurality of alkyl layers and a plurality of siloxane layers are stacked alternately. Therefore, descriptions of details identical to those in the first embodiment will be omitted.

Figure 4:
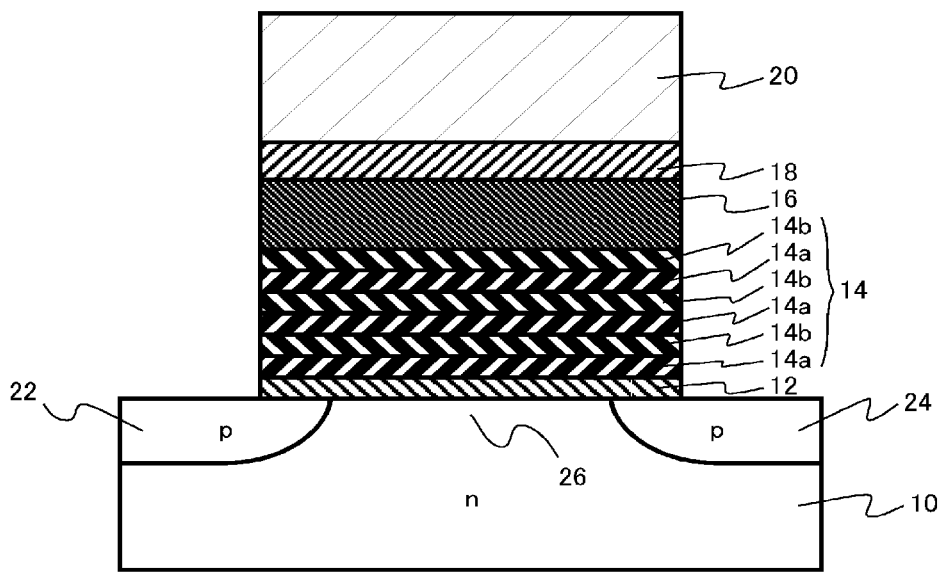
FIG. 4 is a cross-sectional view of a memory cell portion of a semiconductor memory device according to a second embodiment.

FIG. 4 is a cross-sectional view of a memory cell portion of the semiconductor memory device in this embodiment. An organic tunnel insulating layer 14 has a structure in which a plurality of alkyl layers 14a and a plurality of siloxane layers 14b are stacked alternately.

The alkyl layers 14a and the siloxane layers 14b are chemically bonded together alternately on the tunnel insulating layer 12 to form the organic tunnel insulating layer 14.

According to this embodiment, the thickness of the organic tunnel insulating layer 14 is increased, thus further improving the charge retention characteristics.

The thickness of the organic tunnel insulating layer 14 is desirably between 0.5 nm and 3 nm inclusive. When the thickness falls below the above range, the charge retention characteristics can be degraded. When the thickness exceeds the above range, its superiority in thickness over an inorganic tunnel insulating film can be impaired. In terms of achieving the above film-thickness range, the number of times of stacking a combination of the alkyl layer 14a and the siloxane layer 14b is desirably between 3 and 30 inclusive.

Third Embodiment

A semiconductor memory device in this embodiment is identical to that in the first embodiment except that an inorganic tunnel insulating layer is not provided. Therefore, descriptions of details identical to those in the first embodiment will be omitted.

Figure 5:
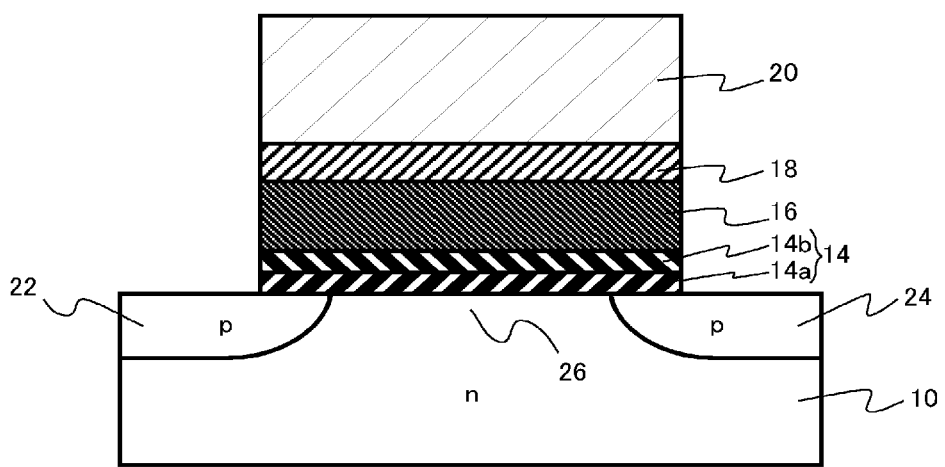
FIG. 5 is a cross-sectional view of a memory cell portion of a semiconductor memory device according to a third embodiment.

FIG. 5 is a cross-sectional view of a memory cell portion of the semiconductor memory device in this embodiment. An organic tunnel insulating layer 14 is formed directly on a semiconductor layer 10.

According to this embodiment, by not providing an inorganic tunnel insulating layer, the total film-thickness of the memory cell can be further reduced. Therefore, an even higher density of memory cells can be achieved.

Fourth Embodiment

A semiconductor memory device in this embodiment is identical to that in the first embodiment except that a memory cell transistor is an n-type transistor using electrons as carriers. Therefore, descriptions of details identical to those in the first embodiment will be omitted.

Figure 6:
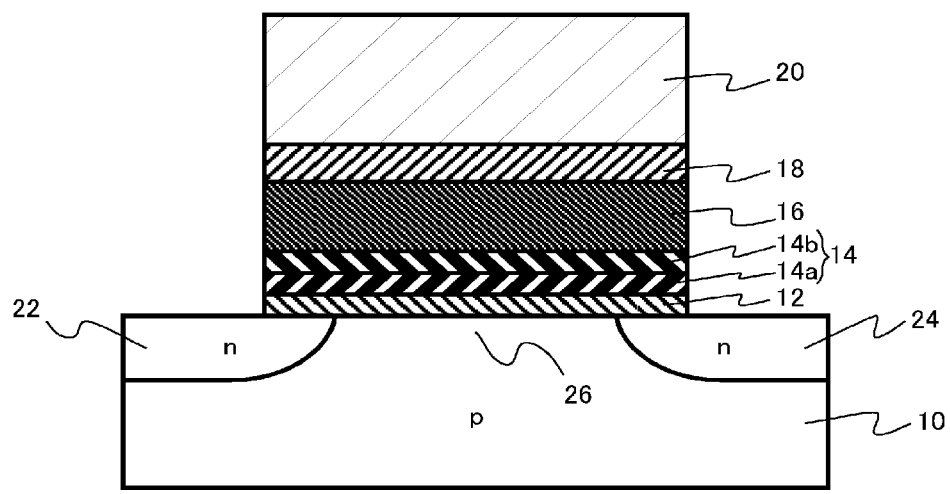
FIG. 6 is a cross-sectional view of a memory cell portion of a semiconductor memory device according to a fourth embodiment.

FIG. 6 is a cross-sectional view of a memory cell portion of the semiconductor memory device in this embodiment.

A semiconductor layer 10 is, for example, p-type single crystal silicon containing p-type impurities. A source region 22 and a drain region 24 are formed, for example, by an n-type diffusion layer containing n-type impurities.

During a write operation of the memory cell in this embodiment, a voltage is applied between a control gate electrode 20 and the semiconductor layer 10 so that the control gate electrode 20 has a relatively positive voltage to store negative charges in a charge storage layer 16. When the control gate electrode 20 has a relatively positive voltage, an inversion layer is formed in a channel region 26, and electrons accumulate. The electrons move through a tunnel insulating layer 12 and an organic tunnel insulating layer 14 to be stored in charge storage molecules in the charge storage layer 16.

In this state, the threshold voltage of the memory cell transistor becomes higher than that in a state where no electrons are stored. That is, the transistor is in a state of being hard to turn on. This state is a state where data "0" is written.

During a data erase operation, a voltage is applied between the control gate electrode 20 and the semiconductor layer 10 so that the control gate electrode 20 has a relatively negative voltage. An electric field between the control gate electrode 20 and the semiconductor layer 10 causes electrons stored in the charge storage layer 16 to move through the tunnel insulating layer 12 and the organic tunnel insulating layer 14 to be pulled out to the semiconductor layer 10.

In this state, the threshold voltage of the memory cell transistor is lower than that in the data "0" state. That is, the transistor is in a state of being easy to turn on. This state is data "1."

During reading of data, a voltage is applied between the source region 22 and the drain region 24. For example, in the data "0" state where electrons are stored, an inversion layer is not formed in the channel region 26 since the threshold voltage of the transistor is high, and no current flows between the source and the drain.

On the other hand, in an erased state, that is, the data "1" state where no charges are stored, an inversion layer is formed in the channel region 26 since the threshold voltage of the transistor is low, and a current flows between the source and the drain. Thus, by detecting the amount of current through the transistor, it is possible to read whether it is data "0" or data "1."

During a data verification operation to verify whether writing is performed adequately after the data write operation is performed, an operation similar to that during the read operation is performed. A voltage is applied between the source region 22 and the drain region 24. When a desired current does not flow, the data write operation is performed again.

The write, erase, and read operations of the memory cell in this embodiment are performed as above for the function as a nonvolatile semiconductor memory device.

In this embodiment, as in the first embodiment, by using the organic tunnel insulating layer 14, a semiconductor memory device with excellent charge retention characteristics can be provided. Further, a higher density of memory cells can be achieved.

Fifth Embodiment

A semiconductor memory device in this embodiment includes a stacked body in which insulating layers and control gate electrodes are stacked alternately, a semiconductor layer facing the control gate electrodes, an organic molecular layer provided between the semiconductor layer and the control gate electrodes, and a first insulating layer provided between the organic molecular layer and the semiconductor layer, the first insulating layer having a first layer containing alkyl chains and a second layer containing siloxane, the second layer being provided between the first layer and the organic molecular layer.

The semiconductor memory device in this embodiment is different from that in the first embodiment in that it is a device of a three-dimensional structure. Descriptions of details identical to those in the first embodiment will be partly omitted.

Figure 7:
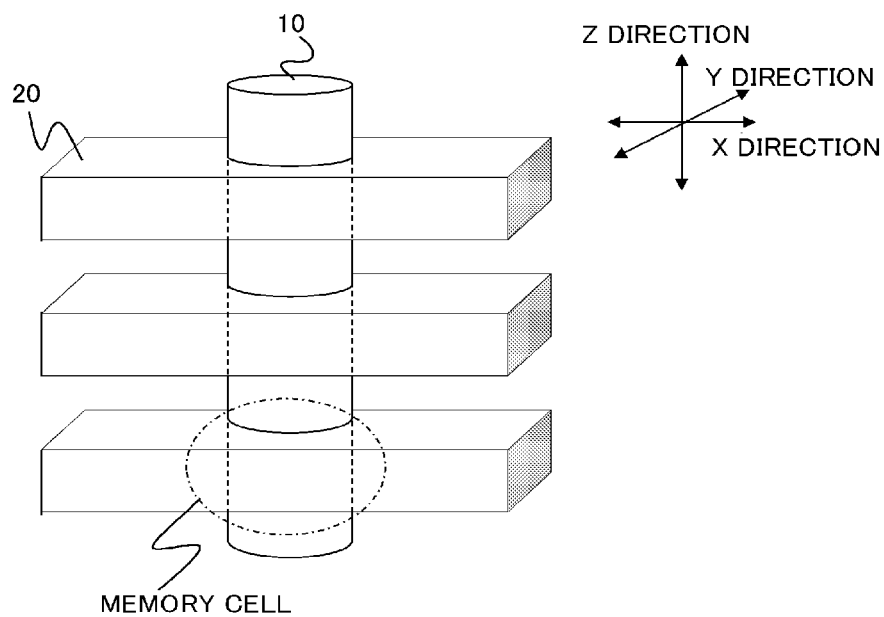
FIG. 7 is a three-dimensional conceptual diagram of a semiconductor memory device according to a fifth embodiment.
Figure 8:
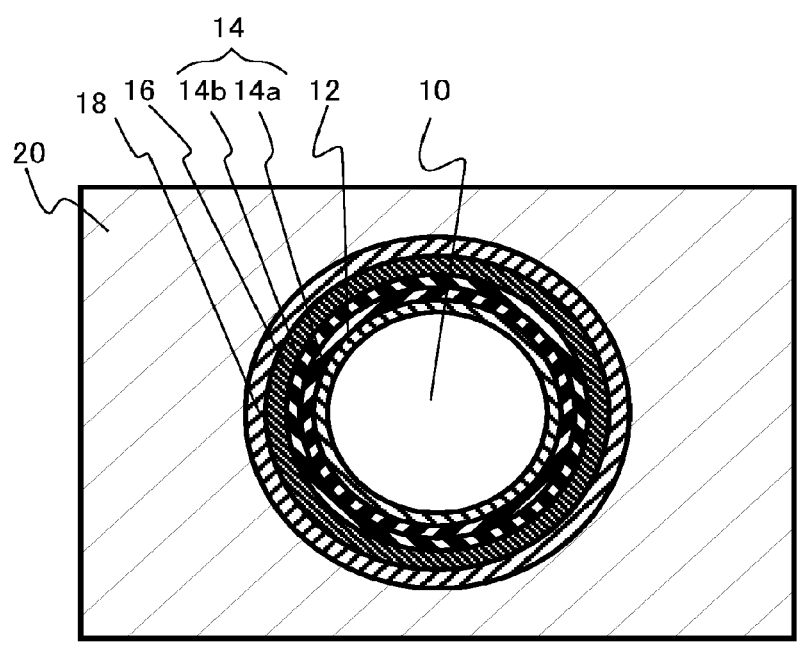
FIG. 8 is a cross-sectional view along XY in FIG. 7.
Figure 8:
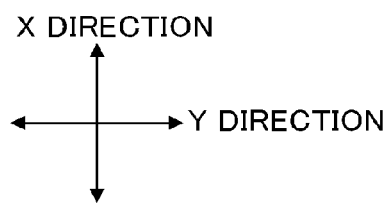
Figure 9:
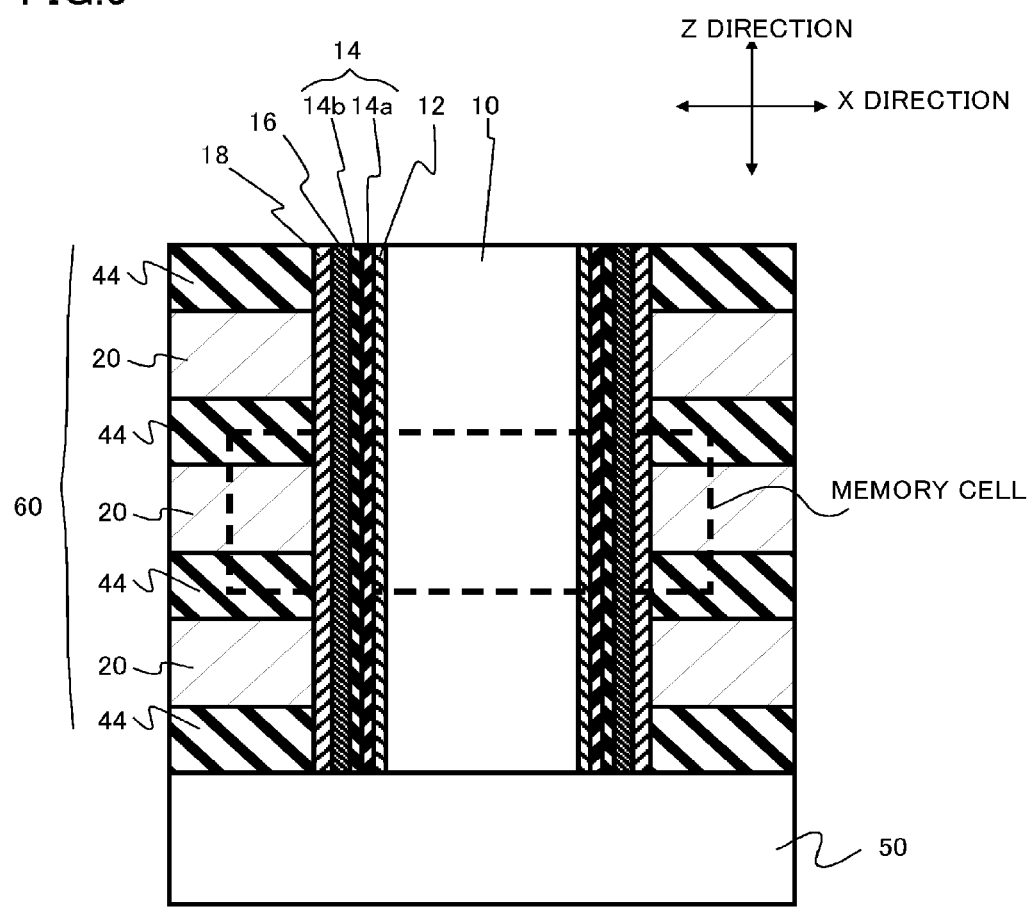
FIG. 9 is a cross-sectional view along XZ in FIG. 7.

FIG. 7 is a three-dimensional conceptual diagram of the semiconductor memory device in this embodiment. FIG. 8 is a cross-sectional view along XY in FIG. 7. FIG. 9 is a cross-sectional view along XZ in FIG. 7.

The semiconductor memory device in this embodiment includes, for example, a stacked body 60 in which insulating layers 44 and control gate electrodes 20 are stacked alternately on a silicon substrate 50.

For example, a hole penetrating therethrough from a top surface of the stacked body 60 to the control gate electrode 20 in the lowermost layer is provided. A block insulating layer 18 is provided on a side surface of the hole, and a charge storage layer 16 is provided on an inner surface of the block insulating layer 18.

An organic tunnel insulating layer 14 and a tunnel insulating layer 12 are provided on an inner surface of the charge storage layer 16. A columnar semiconductor layer 10 is formed on an inner surface of the tunnel insulating layer 12. The semiconductor layer 10 does not necessarily need to be columnar, and may be, for example, a film.

In other words, a semiconductor layer 10 provided opposite to the control gate electrodes 20 is provided. The tunnel insulating layer 12, the organic tunnel insulating layer 14, the charge storage layer 16, and the block insulating layer 18 are provided between the semiconductor layer 10 and the control gate electrodes 20.

In FIGS. 7 and 9, a region enclosed by a broken line constitutes a memory cell. The structure of the memory cell is a structure in which the tunnel insulating layer 12, the organic tunnel insulating layer 14, the charge storage layer 16, and the block insulating layer 18 are formed between the semiconductor layer 10 and the control gate electrodes 20.

The organic tunnel insulating layer 14 includes an alkyl layer (first layer) 14a and a siloxane layer (second layer) 14b.

The three-dimensional structure in this embodiment can be manufactured by using a known method for manufacturing nonvolatile semiconductor memory devices of three-dimensional structures.

By using the organic tunnel insulating layer 14, the semiconductor memory device in this embodiment can provide a semiconductor memory device with excellent charge retention characteristics. Further, according to this embodiment, by making memory cells three-dimensional, the degree of integration of the memory cells is increased, and a nonvolatile semiconductor memory device with an even higher degree of integration than those in the first to fourth embodiments can be provided.

(First Modification)

Figure 10:
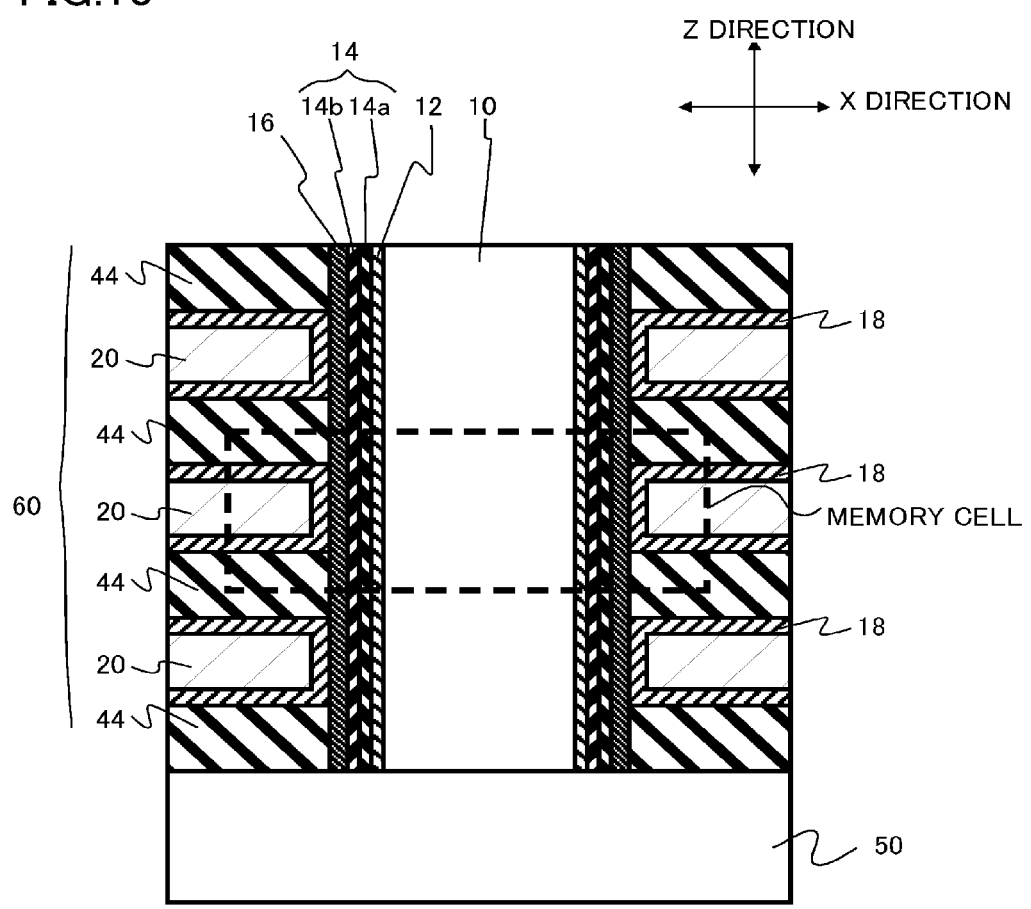
FIG. 10 is a cross-sectional view of a semiconductor memory device according to a first modification of the fifth embodiment.

FIG. 10 is a cross-sectional view of a semiconductor memory device in a first modification of this embodiment, showing a cross-section corresponding to the cross-sectional view in FIG. 9. Block insulating layers 18 are provided along between control gate electrodes 20 and insulating layers 44. The block insulating layers 18 are isolated on a memory cell by memory cell basis in a Z direction.

(Second Modification)

Figure 11:
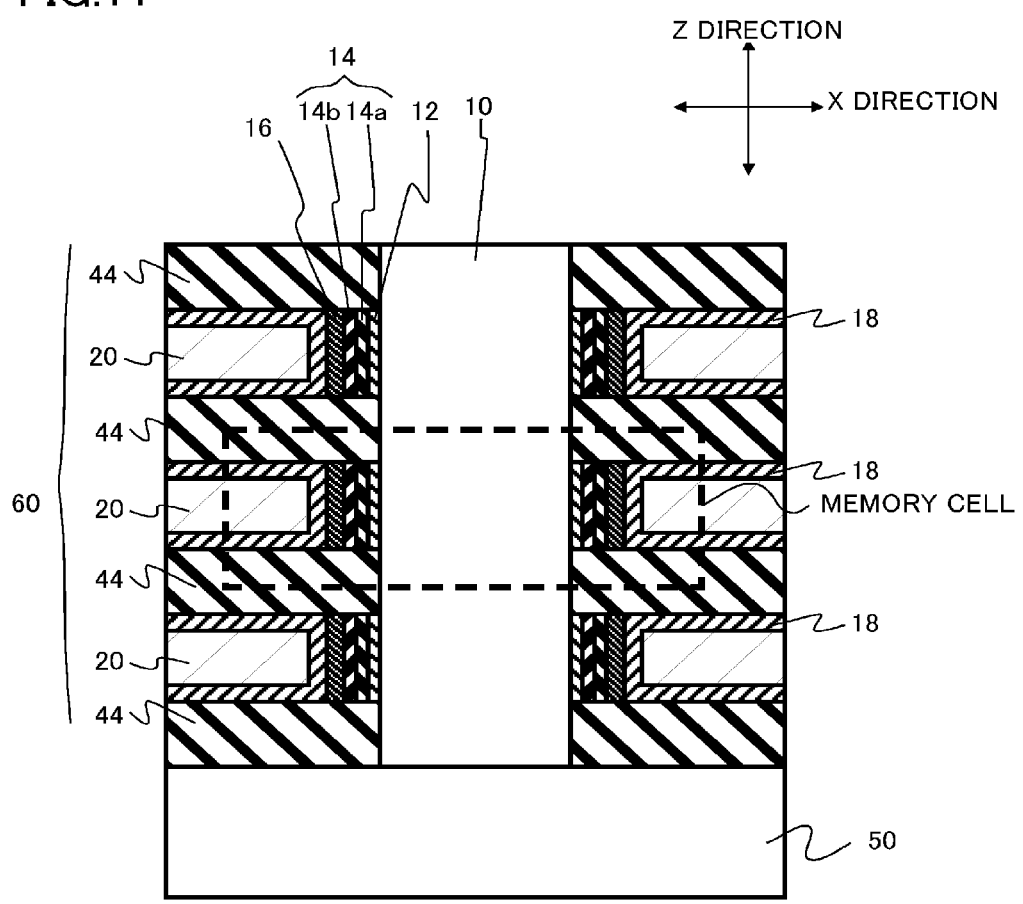
FIG. 11 is a cross-sectional view of a semiconductor memory device according to a second modification of the fifth embodiment.

FIG. 11 is a cross-sectional view of a semiconductor memory device in a second modification of this embodiment, showing a cross-section corresponding to the cross-sectional view in FIG. 9. As in the first modification, block insulating layers 18 are provided along between control gate electrodes 20 and insulating layers 44. The block insulating layers 18 are isolated on a memory cell by memory cell basis in a Z direction. Further, tunnel insulating layers 12, organic tunnel insulating layers 14, and charge storage layers 16 are also isolated on the memory cell by memory cell basis in the Z direction.

EXAMPLES

Hereinafter, examples will be described.

Example 1

Film structures corresponding to the first and second embodiments were created for evaluation.

Using a p-type silicon substrate, a two-terminal device was produced by the following method.

The p-type silicon substrate was introduced into a thermal oxidation furnace to form a silicon oxide film on its surface. The thickness of the silicon oxide film was about 5 nm from a result of a film-thickness measurement.

Next, using a UV cleaning machine, the substrate surface was irradiated with UV light for ten minutes to be dry-cleaned.

Next, formation of an alkyl layer was performed. In a glove box, the cleaned substrate was immersed, for a prescribed period of time, in a dehydrated toluene solution in which 1,8-Bis(Trichlorosilyl)octane was used as alkyl molecules at a concentration of 5 mM. After the immersion, the substrate was put in unused dehydrated toluene and rinsed for one minute.

Next, formation of a siloxane layer was performed. In a glove box, the substrate formed with the alkyl layer was immersed, for a prescribed period of time, in a dehydrated pentane solution in which octachlorosiloxane was used as siloxane molecules at a concentration of 34 mM. After the immersion, the substrate was put in unused dehydrated pentane and rinsed for one minute.

The above-described alkyl layer and siloxane layer formation including the rinses was performed once or a plurality of times to obtain a desired organic tunnel insulating layer. In this example, the alkyl layer/siloxane layer formation was performed once, twice, three times, and five times.

After the formation of the last siloxane layer was performed, the substrate was taken out of the glove box, moved into a mixed solution of toluene and water (a volume mixed ratio of 1:1), and quenched and rinsed at the surface for one minute by an ultrasonic cleaning machine.

Next, the substrate was moved into an unused ethanol solution and rinsed for one minute by an ultrasonic cleaning machine. The rinse operation using the ethanol solution was performed twice in total with the ethanol solution replaced with a new one.

After the rinse with the ethanol solution, the substrate was dried by a nitrogen air duster.

TEM observation of a cross-section of a sample on which the alkyl layer/siloxane layer formation was performed five times was performed. It was confirmed that the total thickness of the alkyl layers/siloxane layers was about 0.9 nm.

Next, formation of a charge storage layer (oxidation-reduction molecular layer) was performed. The substrate formed with the alkyl layer(s)/siloxanelayer(s) was put in a toluene mixed solution in which an adsorption group-containing decyl porphyrin derivative (a porphyrin derivative having an adsorption group at an end of an alkyl chain of a hydrocarbon chain 10) as oxidation-reduction molecules was adjusted to a concentration of 1 mM. Further, a catalyst was added to a concentration of 3% relative to dehydrated toluene, and the substrate was left at rest for twenty-four hours.

Thereafter, the substrate was taken out, moved into an unused toluene solution, and rinsed for one minute by an ultrasonic cleaning machine. The rinse operation using the toluene solution was performed twice in total with the solution replaced with a new one.

Further, the rinsed substrate was moved into an ethanol solution, rinsed for one minute by an ultrasonic cleaning machine, and dried by a nitrogen air duster.

Next, formation of a block insulating layer was performed. The substrate formed with the charge storage layer was introduced into a thermal ALD apparatus, and on the surface on which the decyl porphyrin derivative was adsorbed, a hafnium oxide film was formed at 200° C. A result of a film-thickness measurement showed that the thickness of the hafnium oxide film was about 20 nm.

Then, the backside of the substrate formed with the block insulating layer was immersed in a concentrated hydrofluoric acid aqueous solution to remove excess oxides formed on the backside, and rinsed with pure water. Next, aluminum was vapor-deposited on the backside to form an electrode on the substrate side. On a top surface of hafnium oxide on the substrate, gold was vapor-deposited through a metal shadow mask to form a control gate electrode. Finally, the substrate was introduced into an RTA apparatus, and annealed under an $N_2$ gas atmosphere in which 3% $H_2$ was mixed, at 300° C. for thirty minutes to produce a two-terminal device.

A pulse voltage to write data was applied to the created device. By measuring the capacitance characteristics before and after the pulse voltage application, the amount of stored charge can be determined. Further, from a change over time of the capacitance characteristics after the application of the pulse voltage, charge retention time can be determined.

Example 2

A film structure corresponding to the fourth embodiment was created for evaluation.

Using an n-type silicon substrate, a two-terminal device was produced by the following method.

The n-type silicon substrate was introduced into a thermal oxidation furnace to form a silicon oxide film on its surface. The thickness of the silicon oxide film was about 5 nm from a result of a film-thickness measurement.

Next, using a UV cleaning machine, the substrate surface was irradiated with UV light for ten minutes to be dry-cleaned.

Next, formation of an alkyl layer was performed. In a glove box, the cleaned substrate was immersed, for a prescribed period of time, in a dehydrated toluene solution in which 1,8-Bis(Trichlorosilyl)octane was used as alkyl molecules at a concentration of 5 mM. After the immersion, the substrate was put in unused dehydrated toluene and rinsed for one minute.

Next, formation of a siloxane layer was performed. In a glove box, the substrate formed with the alkyl layer was immersed, for a prescribed period of time, in a dehydrated pentane solution in which octachlorosiloxane was used as siloxane molecules at a concentration of 34 mM. After the immersion, the substrate was put in unused dehydrated pentane and rinsed for one minute.

The above-described alkyl layer and siloxane layer formation including the rinses was performed once or a plurality of times to obtain a desired organic tunnel insulating layer. In this example, the alkyl layer/siloxane layer formation was performed once, twice, three times, and five times.

After the formation of the last siloxane layer was performed, the substrate was taken out of the glove box, moved into a mixed solution of toluene and water (a volume mixed ratio of 1:1), and quenched and rinsed at the surface for one minute by an ultrasonic cleaning machine.

Next, the substrate was moved into an unused ethanol solution, and rinsed for one minute by an ultrasonic cleaning machine. The rinse operation using the ethanol solution was performed twice in total with the ethanol solution replaced with a new one.

After the rinse with the ethanol solution, the substrate was dried by a nitrogen air duster.

TEM observation of a cross-section of a sample on which the alkyl layer/siloxane layer formation was performed five times was performed. Although there are variations in the total thickness of the alkyl layers/siloxane layers, it was confirmed that it was 0.9 nm or more even at a thin place.

Next, the substrate formed with the alkyl layer(s)/siloxane layer(s) was introduced into a thermal ALD apparatus, and a film of three cycles of aluminum oxide was formed at 200° C. on the alkyl layer(s)/siloxane layer(s). A result of a film-thickness measurement showed that the thickness of the aluminum oxide film was about 0.17 nm.

Next, formation of a charge storage layer (oxidation-reduction molecular layer) was performed. Specifically, the substrate was put in a methanol solution in which adsorption group-containing copper complexes as oxidation-reduction molecules were adjusted to a concentration of 0.5 mM, and was left at rest for twenty-four hours.

Thereafter, the substrate was taken out, moved into an unused methanol solution, and rinsed for one minute by an ultrasonic cleaning machine. The rinse operation using the methanol solution was performed twice in total with the solution replaced with a new one.

Further, the rinsed substrate was moved into an ethanol solution, rinsed for one minute by an ultrasonic cleaning machine, and dried by a nitrogen air duster.

Next, formation of a block insulating layer was performed. The substrate formed with the charge storage layer was introduced into a thermal ALD apparatus, and on the surface on which the copper complexes were adsorbed, a hafnium oxide film was formed at 200° C. A result of a film-thickness measurement showed that the thickness of the hafnium oxide film was about 20 nm.

Then, the backside of the substrate was immersed in a concentrated hydrofluoric acid aqueous solution to remove excess oxides formed on the backside, and rinsed with pure water. Next, aluminum was vapor-deposited on the backside to form an electrode on the substrate side. On a top surface of hafnium oxide on the substrate, gold was vapor-deposited through a metal shadow mask to form a control gate electrode. Finally, the substrate was introduced into an RTA apparatus, and annealed under an $N_2$ gas atmosphere in which 3% $H_2$ was mixed, at 300° C. for thirty minutes to produce a two-terminal device.

A pulse voltage to write data was applied to the created device. By measuring the capacitance characteristics before and after the pulse voltage application, the amount of stored charge can be determined. Further, from a change over time of the capacitance characteristics after the application of the pulse voltage, charge retention time can be determined.

Comparative Example 1

As in Example 1, a film structure corresponding to the first embodiment was created for evaluation. However, the alkyl layer/siloxane layer formation process performed in Example 1 was not performed. Comparative Example 1 is otherwise identical to Example 1, and will not be described.

Comparative Example 2

As in Example 1 and Comparative Example 1, a film structure corresponding to the first embodiment was created for evaluation. However, the alkyl layer/siloxane layer formation process performed in Example 1 was not performed. Instead, the substrate was introduced into a thermal ALD apparatus to form a silicon oxide film at 150° C. A result of a film-thickness measurement showed that the thickness of the silicon oxide film was about 1 nm. Comparative Example 2 is identical to Example 1 except for this process change, and will not be described.

Comparative Example 3

As in Example 2, a film structure corresponding to the fourth embodiment was created for evaluation. However, the alkyl layer/siloxane layer formation process performed in Example 2 was not performed. Comparative Example 3 is otherwise identical to Example 2, and will not be described.

Comparative Example 4

As in Example 2 and Comparative Example 3, a film structure corresponding to the fourth embodiment was created for evaluation. However, the alkyl layer/siloxane layer formation process performed in Example 2 was omitted. Instead, the substrate was introduced into a thermal ALD apparatus to form a silicon oxide film at 150° C. A result of a film-thickness measurement showed that the thickness of the silicon oxide film was about 1 nm. Comparative Example 4 is identical to Example 2 except for this process change, and will not be described.

The backside aluminum electrode of each of the devices in Examples 1 and 2 and Comparative Examples 1 to 4 was brought into contact with a stage of a measurement device to obtain a terminal, a measurement probe was brought into contact with the top surface gold electrode to obtain a terminal, and a voltage was applied. Capacitance measurements were performed on the devices, changing the voltage, and then a pulse voltage was applied to write data.

Figure 12:
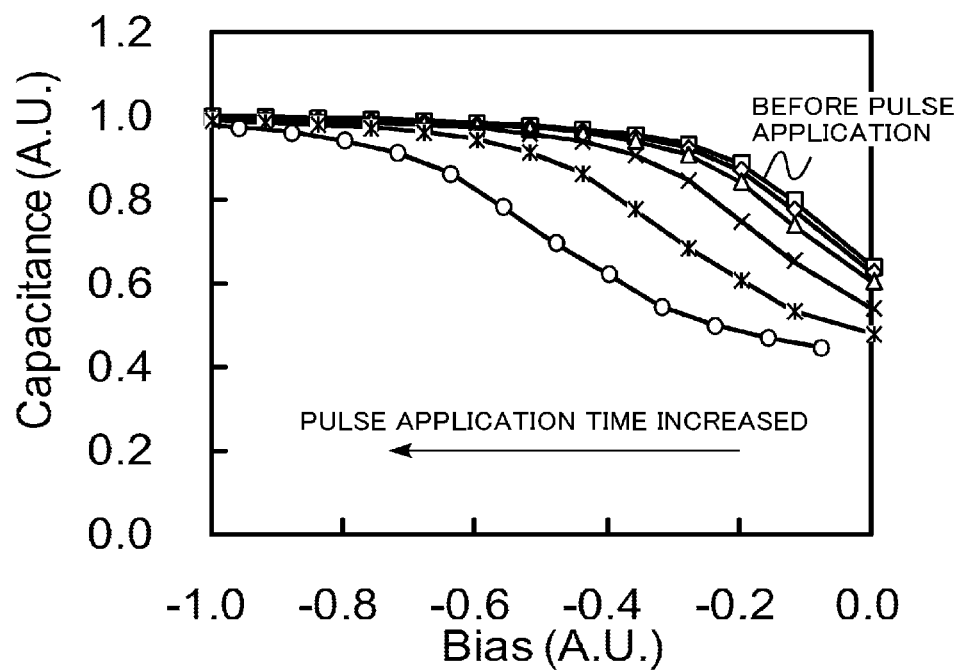
FIG. 12 is a graph showing results of capacitance measurements in Example 1.

FIG. 12 is a graph showing results of the capacitance measurements in Example 1, a graph that superimpose results of capacitance measurements performed on the devices in Example 1 each time pulse application time was changed successively from 100 μs to 1 s with the voltage fixed at −18 V.

It was confirmed that a capacitance saturated region was seen, and the capacitor characteristics shifted in a minus direction as the pulse application time was increased. The voltage shift shows that the pulse voltage applied from the gold gate electrode causes positive charges (holes) to move from the p-type silicon substrate to the charge storage layer, and the positive charges are stored in the charge storage layer.

Next, stored charge retention characteristics were measured on Example 1 and Comparative Examples 1 and 2. The retention characteristics were evaluated by performing a capacitance measurement immediately after a write pulse was applied to the devices, then performing a capacitance measurement again after the devices were left alone for a certain period of time, and measuring a change over time of the capacitor characteristics.

Figure 13:
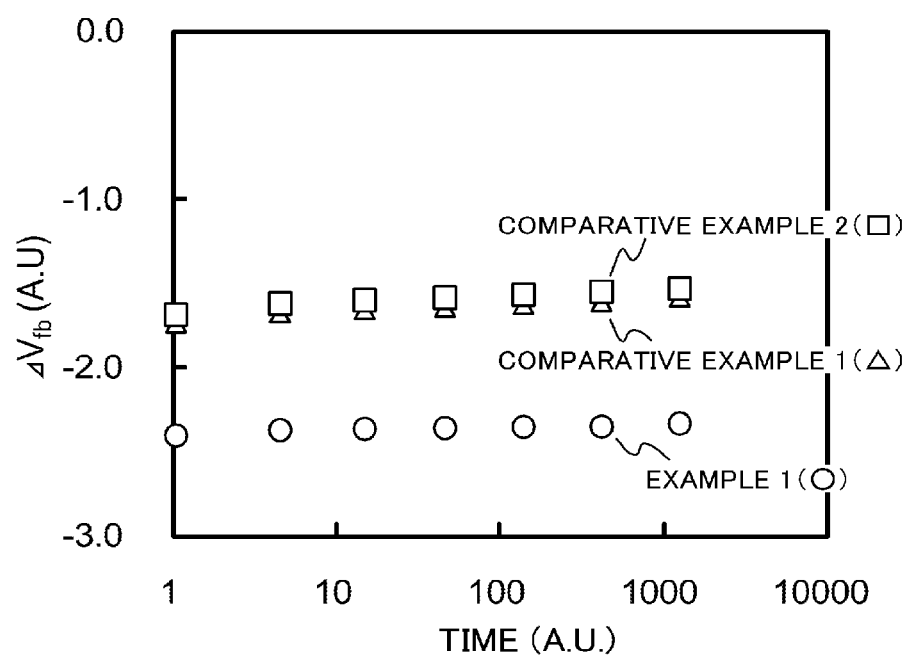
FIG. 13 is a graph showing charge retention characteristics in Example 1, Comparative Example 1, and Comparative Example 2.
Figure 14:
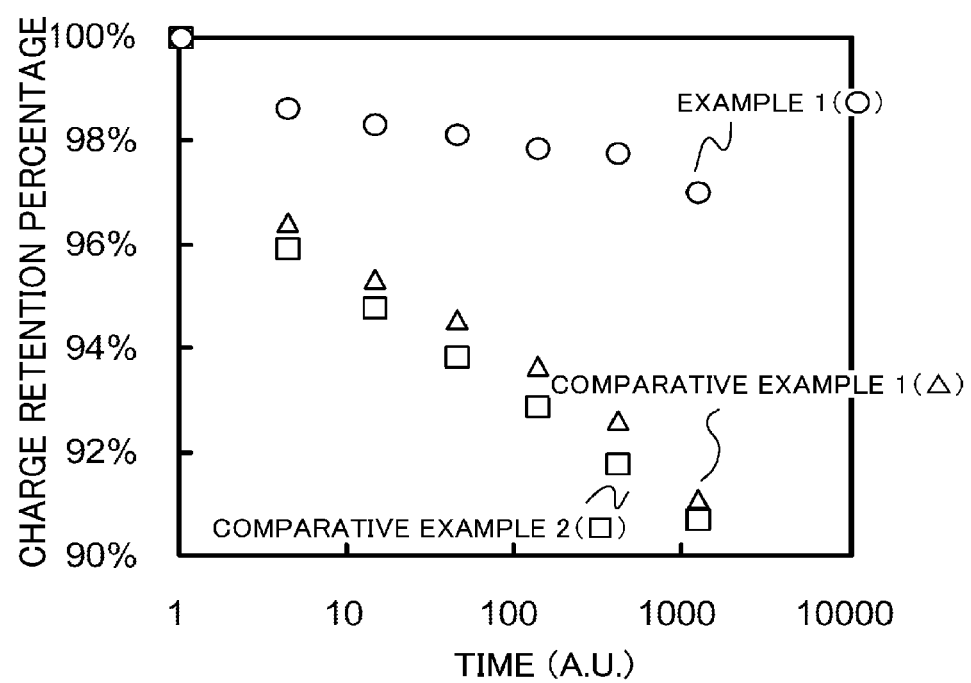
FIG. 14 is a graph showing charge retention percentages in Example 1, Comparative Example 1, and Comparative Example 2.

FIG. 13 is a graph showing the charge retention characteristics in Example 1 and Comparative Examples 1 and 2. FIG. 14 is a graph showing charge retention percentages in Example 1 and Comparative Examples 1 and 2. Results in the example in FIGS. 13 and 14 are results of the device on which the alkyl layer/siloxane layer formation process was repeated five times.

A pulse voltage was controlled and applied to the gold control gate electrodes so that stored charge densities in the devices were almost equal. By performing a measurement of the threshold voltage ($V_{fb}$) of a capacitance shifted by positive charges being stored after a lapse of a certain period of time, and determining a change over time of the threshold voltage, temporal decay in the amount of stored charge was evaluated.

In FIG. 13, a vertical axis represents the amount of change ($\Delta V_{fb}$) in the threshold voltage ($V_{fb}$). The amount of change ($\Delta V_{fb}$) is a value of each $V_{fb}$ calculated from a measurement after each elapsed time from which $V_{fb}$ calculated from a measurement before writing is subtracted. A horizontal axis represents elapsed time.

An approximation line was logarithmically drawn on plotted points in FIG. 13 to determine time until 5% decay (−5% RT) with respect to an initial voltage shift value measured immediately after the write pulse application. FIG. 14 is a graph in which percentages of stored charges are plotted with respect to elapsed time.

The time until the threshold voltage ($\Delta V_{fb}$) decays 5% in Example 1 was about 420700 times that in Comparative Example 1, and about 26600 times that in Comparative Example 2. It was found that Example 1 had excellent charge retention characteristics.

The absolute values of decay time in Comparative Example 1 and Comparative Example 2 were almost in the same level. Addition of silicon oxide of 1 nm formed by ALD directly as the actual film-thickness of a tunnel insulating layer does not change decay time much.

On the other hand, in Example 1 where the alkyl layer/siloxane layer formation was performed five times, the charge retention characteristics were improved although the total thickness of the alkyl layers/siloxane layers is only about 0.9 nm. This result exceeded expectations of those skilled in the art.

Figure 15:
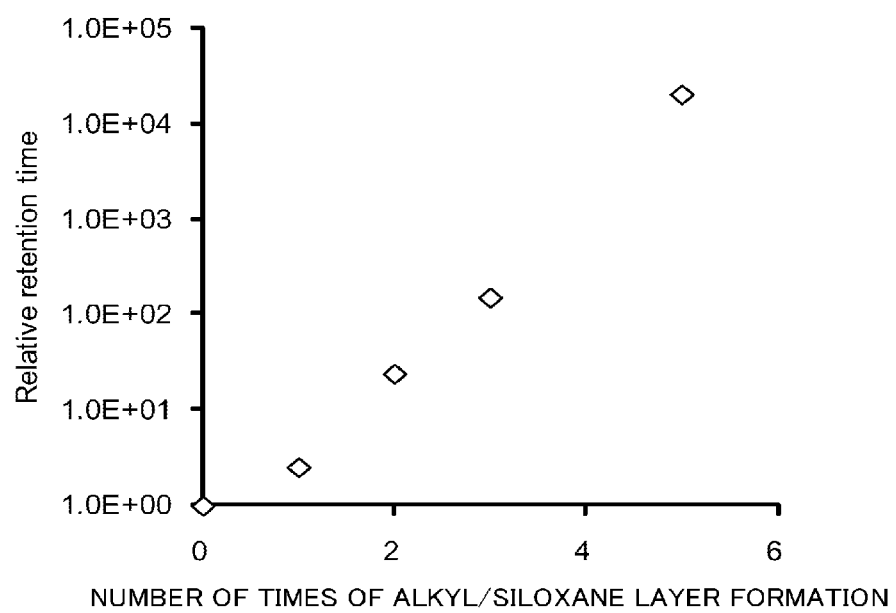
FIG. 15 is a graph showing the relationship between the charge retention characteristics and the number of times of alkyl layer/siloxane layer formation in Example 1.

FIG. 15 is a graph showing the relationship between the charge retention characteristics and the number of times of alkyl layer/siloxane layer formation in Example 1, a graph that compares −5% RT determined from the respective charge retention characteristics in the devices on which the number of repetitions of the alkyl layer/siloxane layer formation was changed to one, two, three, and five in Example 1.

FIG. 15 is a graph in which the ratios of −5% RT of the devices when −5% RT of the device on which the number of repetitions is one is set at 1 are plotted on a vertical axis, and the number of repetitions is plotted on a horizontal axis. As the number of repetitions increased, −5% RT successively increased. Thus, it was found that the retention characteristics have a correlation with the number of times of the alkyl layer/siloxane layer formation.

Next, stored charge retention characteristics were measured on Example 2 and Comparative Examples 3 and 4. The retention characteristics were evaluated by performing a capacitance measurement immediately after a write pulse was applied to the devices, then performing a capacitance measurement again after the devices were left alone for a certain period of time, and measuring a change over time of the capacitor characteristics. In Example 2 and Comparative Examples 3 and 4, the storage of electrons was evaluated.

Figure 16:
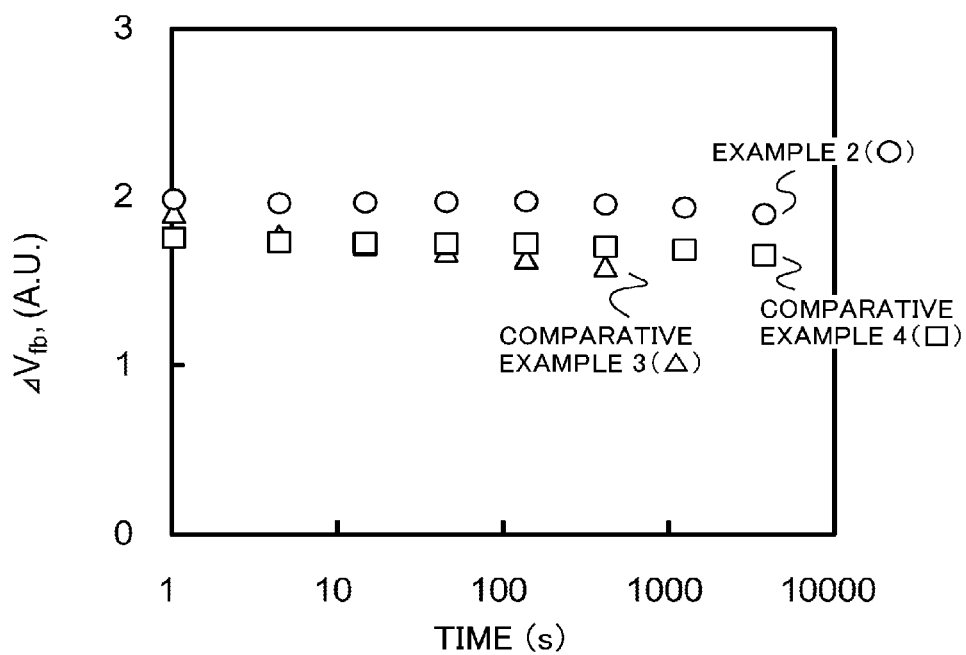
FIG. 16 is a graph showing charge retention characteristics in Example 2, Comparative Example 3, and Comparative Example 4.
Figure 17:
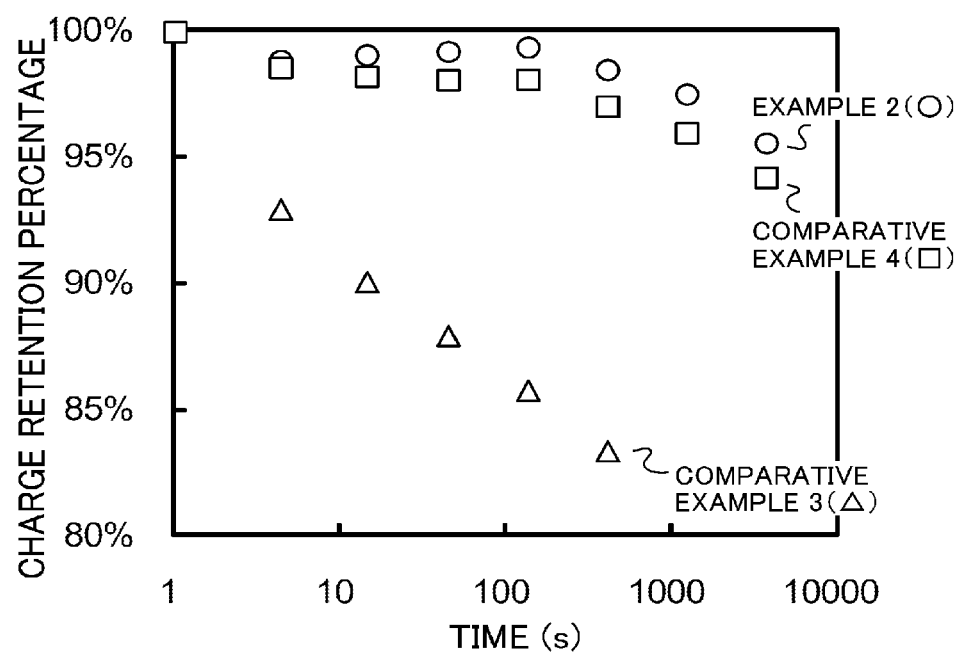
FIG. 17 is a graph showing charge retention percentages in Example 2, Comparative Example 3, and Comparative Example 4.

FIG. 16 is a graph showing the charge retention characteristics in Example 2 and Comparative Examples 3 and 4. FIG. 17 is a graph showing charge retention percentages in Example 2 and Comparative Examples 3 and 4. Results in the example in FIGS. 16 and 17 are results of the device on which the alkyl layer/siloxane layer formation process was repeated five times.

A pulse voltage was controlled and applied to gold control gate electrodes so that stored charge densities in the devices are almost equal. By performing a measurement of the threshold voltage ($V_{fb}$) of a capacitance shifted by negative charges being stored after a lapse of a certain period of time, and determining a change over time of the threshold voltage, temporal decay in the amount of stored charge was evaluated.

In FIG. 16, a vertical axis represents the amount of change ($\Delta V_{fb}$) in the threshold voltage ($V_{fb}$). The amount of change ($\Delta V_{fb}$) is a value of each $V_{fb}$ calculated from a measurement after each elapsed time from which $V_{fb}$ calculated from a measurement before writing is subtracted. A horizontal axis represents elapsed time.

An approximation line was logarithmically drawn on plotted points in FIG. 16 to determine time until 5% decay (−5% RT) with respect to an initial voltage shift value measured immediately after the write pulse application. FIG. 17 is a graph in which percentages of stored charges are plotted with respect to elapsed time.

The time until the threshold voltage ($\Delta V_{fb}$) decays 5% in Example 2 was about 674 times that in Comparative Example 3, and about 54 times that in Comparative Example 4. It was found that Example 2 had excellent charge retention characteristics.

When electrons are stored, an improvement in charge retention characteristics is more difficult than when holes are stored. However, in Example 2 where the alkyl layer/siloxane layer formation was performed five times, although the total thickness of the alkyl layers/siloxane layers is only about 0.9 nm at a thin place, the retention characteristics were improved more than in Comparative Example 4 where the addition of silicon oxide increased the thickness by 1 nm. This result exceeded expectations of those skilled in the art.

Figure 18:
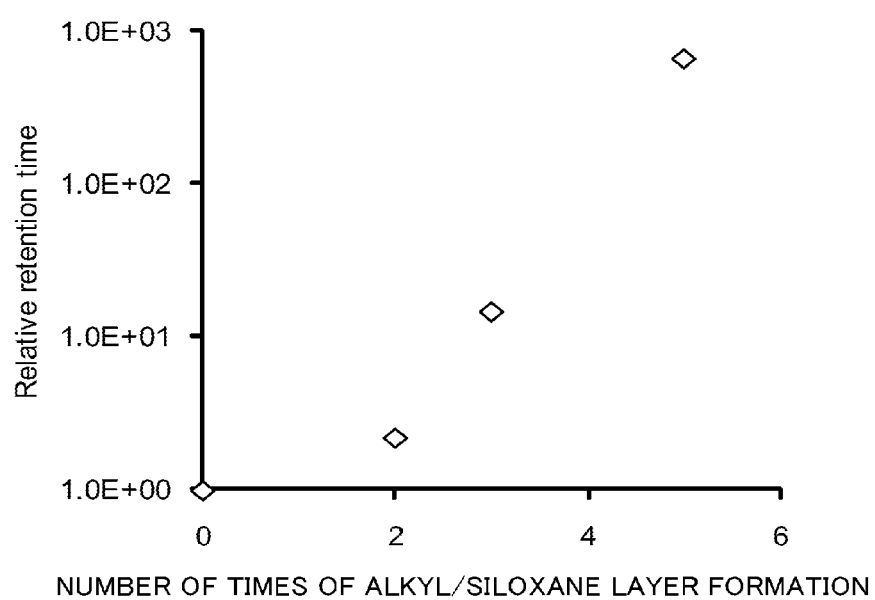
FIG. 18 is a graph showing the relationship between the charge retention characteristics and the number of times of alkyl layer/siloxane layer formation in Example 2.

FIG. 18 is a graph showing the relationship between the charge retention characteristics and the number of times of the alkyl layer/siloxane layer formation in Example 2, a graph that compares −5% RT determined from the respective charge retention characteristics in the devices on which the number of repetitions of the alkyl layer/siloxane layer formation was changed to one, two, three, and five in Example 2.

FIG. 18 is a graph in which the ratios of −5% RT of the devices when −5% RT of the device on which the number of repetitions is one is set at 1 are plotted on a vertical axis, and the number of repetitions is plotted on a horizontal axis. As the number of repetitions increased, −5% RT increased. Thus, it was found that the retention characteristics have a correlation with the number of times of the alkyl layer/siloxane layer formation.

While certain embodiments have been described, these embodiments have been presented by way of example only, and are not intended to limit the scope of the inventions. Indeed, the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising: a semiconductor layer; a control gate electrode; an organic molecular layer provided between the semiconductor layer and the control gate electrode; and a first insulating layer provided between the organic molecular layer and the semiconductor layer, the first insulating layer having a first layer containing alkyl chains and a second layer containing siloxane, the second layer being provided between the first layer and the organic molecular layer, wherein the first insulating layer contains a structure formed by chemical bonding of a first precursor described by molecular formula (1) and a second precursor described by molecular formula (2):

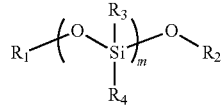

wherein X, Y are independently selected from among silyl ether, phosphoryl ether, alkoxy, carbonyl, and ether, n is an integer greater than 0, R1 to R4 are independently selected from hydrogen, oxygen, silicon, hydrocarbon, halogen, halogenated silane, alkoxy silane, and silyl ether, and m is an integer greater than 0.

2. The device according to claim 1, wherein carbon number of each of the alkyl chains is between 4 and 30 inclusive.

3. The device according to claim 1, wherein the first layer is a monomolecular film.

4. The device according to claim 1, further comprising an inorganic second insulating layer provided between the first insulating layer and the semiconductor layer.

5. The device according to claim 1, further comprising a third insulating layer between the organic molecular layer and the control gate electrode.

6. The device according to claim 1, wherein the first layer is chemically bonded to the semiconductor layer.

7. The device according to claim 4, wherein the first layer is chemically bonded to the second insulating layer.

8. The device according to claim 1, wherein the organic molecular layer has oxidation-reduction molecules.

* * * * *